US012745580B2

(12) United States Patent
Yang et al.

(10) Patent No.: US 12,745,580 B2
(45) Date of Patent: Sep. 22, 2026

(54) SELF-ALIGNED LITHO-ETCH-LITHO-ETCH MANDREL CUT PROCESS FOR ADVANCED FINFET INTERCONNECT

(71) Applicant: INTERNATIONAL BUSINESS MACHINES CORPORATION, Armonk, NY (US)

(72) Inventors: Xiaoming Yang, Clifton Park, NY (US); Lawrence A. Clevenger, Saratoga Springs, NY (US)

(73) Assignee: International Business Machines Corporation, Armonk, NY (US)

(*) Notice: Subject to any disclaimer, the term of this patent is extended or adjusted under 35 U.S.C. 154(b) by 603 days.

(21) Appl. No.: 18/190,085

(22) Filed: Mar. 25, 2023

(65) Prior Publication Data

US 2024/0321587 A1 Sep. 26, 2024

(51) Int. Cl.

*H10P 50/00* (2026.01)
*H10W 20/00* (2026.01)

(Continued)

(52) U.S. Cl.

CPC ........... *H10P 50/73* (2026.01); *H10W 20/089* (2026.01); *H10W 20/43* (2026.01); *H10W 20/48* (2026.01)

(58) Field of Classification Search

CPC ..... H10P 50/73; H10W 20/089; H10W 20/43; H10W 20/48; H10W 20/069;

(Continued)

(56) References Cited

U.S. PATENT DOCUMENTS 9,478,462 B1 10/2016 Wang
9,735,029 B1 8/2017 Chu et al.

(Continued)

FOREIGN PATENT DOCUMENTS

CN 115692175 A * 2/2023 ........... H01L 21/033
EP 3901987 A1 10/2021

(Continued)

OTHER PUBLICATIONS

Taiwan Patent Office, "Notice of Allowance," Nov. 1, 2024, 6 Pages, TW Application No. 113101405.

(Continued)

*Primary Examiner* — Galina G Yushina
(74) *Attorney, Agent, or Firm* — Samuel A. Waldbaum

(57) ABSTRACT

A method of fabricating a semiconductor device, includes providing a semiconductor structure having a dielectric stack and a mandrel layer positioned on the dielectric stack. An array of sacrificial mandrel features are patterned into the mandrel layer and on top of an insulating layer of the dielectric stack. A self-aligned non-mandrel cut is formed adjacent a spacer element located adjacent to one of the sacrificial mandrel features. The sacrificial mandrel features are removed. One or more self-aligned mandrel cuts are formed in one or more of the plurality of trenches. Non-mandrel openings are formed on top of the insulating layer. Continuity line openings are etched into the dielectric stack, wherein the non-mandrel cut interrupts a first of the continuity line openings and the mandrel cut is disposed to interrupt a second of the continuity line openings. Metal lines are formed in the continuity line openings, except where the non-mandrel cut and mandrel cut are disposed.

8 Claims, 17 Drawing Sheets

(51) Int. Cl.
*H10W 20/43* (2026.01)
*H10W 20/48* (2026.01)

(58) Field of Classification Search
CPC ........... H10W 20/057; H01L 21/31144; H01L 21/76816; H01L 23/528; H01L 23/5329; H01L 21/76897; H01L 21/76879
See application file for complete search history.

(56) References Cited

U.S. PATENT DOCUMENTS

| | | | | |
|---|---|---|---|---|
| 9,812,351 | B1 | 11/2017 | Licausi | |
| 9,818,640 | B1 | 11/2017 | Stephens et al. | |
| 9,818,641 | B1 * | 11/2017 | Bouche | H01L 21/76897 |
| 9,941,154 | B2 | 4/2018 | Song | |
| 10,056,258 | B2 | 8/2018 | Huang | |
| 10,192,780 | B1 * | 1/2019 | Wang | H01L 21/31144 |
| 10,199,270 | B2 | 2/2019 | Bombardier | |
| 10,388,525 | B2 | 8/2019 | Bergendahl et al. | |
| 10,573,528 | B2 | 2/2020 | Lie | |
| 10,770,295 | B2 | 9/2020 | Lazzarino | |
| 11,139,205 | B2 | 10/2021 | Zhong | |
| 11,164,772 | B2 | 11/2021 | Felix | |
| 11,239,077 | B2 | 2/2022 | Liu | |
| 11,264,271 | B2 | 3/2022 | O'Toole | |
| 11,276,607 | B2 | 3/2022 | Arnold | |
| 2013/0065397 | A1 | 3/2013 | Chen | |
| 2014/0282289 | A1 | 9/2014 | Hsu | |
| 2019/0206725 | A1 | 7/2019 | Chu et al. | |
| 2020/0098580 | A1 | 3/2020 | Pan | |
| 2021/0082800 | A1 | 3/2021 | Schenker et al. | |
| 2021/0143013 | A1 | 5/2021 | Liu et al. | |
| 2021/0151377 | A1 | 5/2021 | Liu et al. | |
| 2021/0272806 | A1 | 9/2021 | Topaloglu et al. | |
| 2021/0305089 | A1 | 9/2021 | Philip et al. | |
| 2021/0407804 | A1 * | 12/2021 | Ko | G03F 7/091 |
| 2022/0102212 | A1 * | 3/2022 | Su | H10P 50/73 |
| 2022/0406658 | A1 | 12/2022 | Clevenger et al. | |

FOREIGN PATENT DOCUMENTS

| | | | |
|---|---|---|---|
| KR | 2018-0064273 | A | 6/2018 |
| KR | 2022-0043851 | A | 4/2022 |
| KR | 2023-0037737 | A | 3/2023 |
| TW | 201814829 | A | 4/2018 |
| TW | 201830521 | A | 8/2018 |

OTHER PUBLICATIONS

Intellectual Property Office, "Written Decision on Registration," May 13, 2026, 11 Pages, KR Application No. 10-2025-7011459.

International Searching Authority, "Notification of Transmittal of the International Search Report and the Written Opinion of the International Searching Authority, or Declaration," Patent Cooperation Treaty, Jun. 17, 2024, 12 pages, International Application No. PCT/EP2024/057029.

* cited by examiner 140
135
130
125
120
115
110
105

140
135

132
125
120
115
110
105

132
125

132
142
125
120
115
110
105

132
138
125

155
132
160
160
142
160
125
120
115
110
105

132
155
142
160

142
155
165
160
125
120
115
110
105

142
155
125
160
165

SELF-ALIGNED LITHO-ETCH-LITHO-ETCH MANDREL CUT PROCESS FOR ADVANCED FINFET INTERCONNECT

BACKGROUND

Technical Field

The present disclosure generally relates to semiconductor device fabrication, and more particularly, to a self-aligned litho-etch-litho-etch (SALELE) mandrel cut process for advanced FINFET interconnect.

Description of the Related Art

In semiconductor device manufacture, self-aligned multiple patterning processes are being used as practical solutions for the manufacturing process. For example, a back-end-of-line (BEOL) interconnect structure may be used to connect device structures, which have been fabricated on a substrate during front-end-of-line (FEOL) processing. Self-aligned patterning processes used to form a BEOL interconnect structure involve linear mandrels acting as sacrificial features that establish a feature pitch. Non-mandrel lines are arranged as linear spaces between sidewall spacers that are formed adjacent to the sidewalls of the mandrels. After the mandrels are pulled to define mandrel lines, the sidewall spacers are used as an etch mask to etch a pattern predicated on the mandrel lines and the non-mandrel lines into an underlying hardmask. The pattern is subsequently transferred from the hardmask to an interlayer dielectric layer to define trenches in which the wires of the BEOL interconnect structure are formed.

Mandrel cuts may be formed in the mandrels. Non-mandrel cuts may be formed along non-mandrel lines and may include portions of the spacer material used to form the sidewall spacers. The mandrel cuts and non-mandrel cuts are included in the pattern that is transferred to the hardmask and subsequently transferred from the hardmask to form the trenches in the interlayer dielectric layer.

SUMMARY

In general, embodiments provide a process and device that form a mandrel cut feature after the mandrel pulling process. A non-mandrel cut may be formed prior to mandrel pulling. As will be appreciated, the mandrel and non-mandrel cuts are self-aligned but since the mandrel cut is performed after spacer deposition, variations in the critical dimension can be controlled if not eliminated. For example, the spacer pinch-off process may not have to be performed. Instead, the mandrel and non-mandrel cut sections may be patterned using a self-alignment technique. Thus, the pitch spacing between continuity lines and cuts become (e.g., are disposed to be) more evenly spaced.

According to an embodiment of the present disclosure, a method of fabricating a semiconductor device is provided. The method includes providing a semiconductor structure having a dielectric stack and a mandrel layer positioned on the dielectric stack. An array of sacrificial mandrel features is patterned into the mandrel layer and on top of an insulating layer of the dielectric stack. A self-aligned non-mandrel cut is formed adjacent a spacer element located adjacent one of the sacrificial mandrel features. The sacrificial mandrel features are removed. Removal of the sacrificial mandrel features creates a plurality of trenches. Self-aligned mandrel cuts are formed in one of the plurality of trenches after removal of the sacrificial mandrel features. Non-mandrel openings are formed on top of the insulating layer. Continuity line openings are etched into the dielectric stack. The non-mandrel cut is disposed to interrupt a first of the continuity line openings. The self-aligned mandrel cut is disposed to interrupt a second of the continuity line openings. Metal lines are formed in the continuity line openings, except where the self-aligned non-mandrel cut and the self-aligned mandrel cut are disposed.

In one embodiment, mandrel spacers are formed as self-aligned on sidewalls of the sacrificial mandrel features. The thickness of the mandrel spacers is easily controlled and are not subject to variations from pinch-off. Consequently, the edges of spacer walls become more consistent.

According to another embodiment of the present disclosure, a semiconductor chip device is provided. The semiconductor device includes a substrate. A dielectric interconnect layer is positioned on top of the substrate. A plurality of metal lines are positioned in the dielectric interconnect layer. A self-aligned mandrel cut is present in at least one of the metal lines. A self-aligned non-mandrel cut is present in at least one of the metal lines.

In one embodiment, the spacing between the plurality of metal lines is evenly distributed. The even spacing avoids unintentional bridging between metal lines and cuts in the lines.

According to another embodiment of the present disclosure, a semiconductor device interconnect layer is provided. The semiconductor device interconnect layer includes a dielectric substrate. A first metal line extends in a first direction of the dielectric substrate. A second metal line extends in the first direction. The second metal line is parallel with the first metal line. A first dielectric region is in a first space between the first metal line and the second metal line. A self-aligned mandrel cut is present in the first metal line. A non-mandrel cut is present in the second metal line.

In one embodiment, the first dielectric region and the second dielectric region are self-aligned relative to the first metal line and the second metal line. This feature avoids pitch walking that may occur when spacer thicknesses are inconsistent and arbitrary between cuts and metal lines.

According to an embodiment of the present disclosure, a method of fabricating a semiconductor device is provided. The method includes providing a semiconductor structure having a dielectric stack, an interconnect layer in the dielectric stack, and a mandrel layer positioned on the dielectric stack. An array of mandrels is patterned into the mandrel layer and on top of an insulating layer of the dielectric stack. A self-aligned non-mandrel cut is formed adjacent to a spacer located adjacent to one of the mandrels. The mandrels are removed which creates a plurality of parallel trenches. A self-aligned mandrel cut is formed in one of the plurality of trenches. Non-mandrel openings are formed on top of the insulating layer. The non-mandrel openings are parallel to the plurality of trenches. Continuity lines are formed in the interconnect layer. The continuity lines are formed in the plurality of trenches and in the non-mandrel openings. A first of the continuity lines includes the non-mandrel cut. A second of the continuity lines includes the mandrel cut.

In one embodiment, the mandrel cut is positioned staggered from the non-mandrel cut. Staggering cuts that have consistent critical dimensions becomes possible when forming the cuts before and after mandrel pulling. Trying to stagger cuts using a pinch-off method generally produces variations in the critical dimension of a cut as the scale of fabrication is performed in the seven nanometer or smaller range in the future.

The techniques described herein may be implemented in a number of ways. Example implementations are provided below with reference to the following figures.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

Figure 1A:
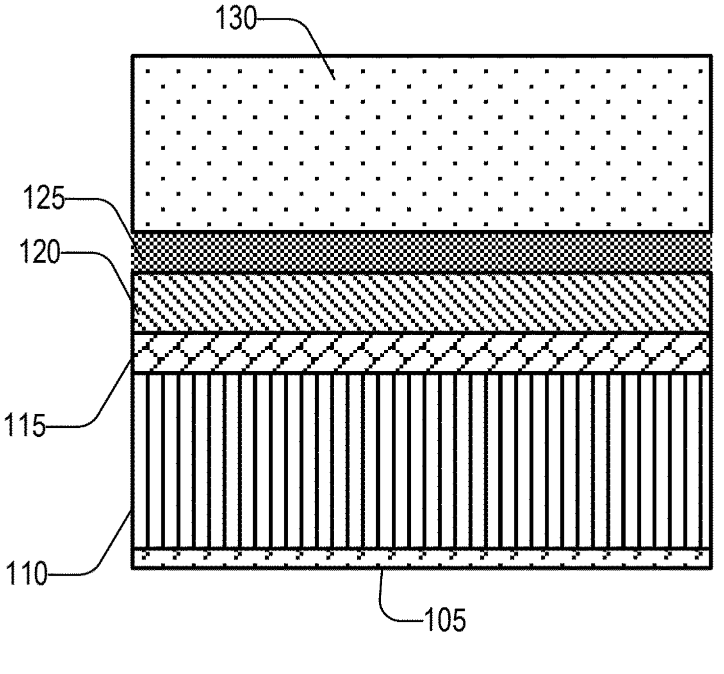
FIG. 1A is a cross-sectional schematic view of starting film deposition formation for a semiconductor device, consistent with embodiments of the present disclosure.
Figure 1B:
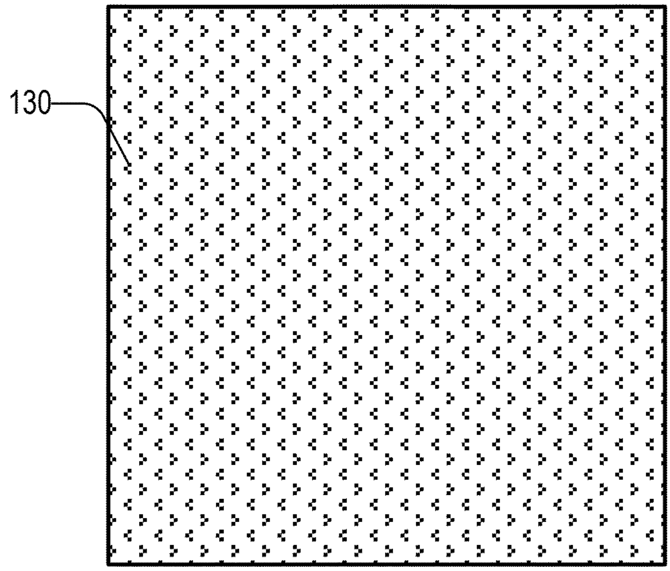
FIG. 1B is a top view of the formation of FIG. 1A.

In conventional multiple patterning processes, controlling the mandrel dimensions at different feature locations can be a challenge. As fabrication technology moves into the 7-nanometer scale, the ability to control mandrel and non-mandrel features uniformly across a wafer becomes highly dependent on controlling the critical dimension of a mandrel cut and providing uniform spacing. A spacer feature is generally used to define the space between mandrels and non-mandrel lines.

If the critical dimension for a mandrel cut is too big, the cut cannot be fully pinched-off by a spacer. The result may create a non-mandrel line bridge between features. However, in order to prevent critical dimension pitch variations between features (also known as "pitch-walking"), adjusting spacer thickness arbitrarily is not a reliable solution. If the critical dimension for mandrel cut is too small, the critical dimension for the cut cannot be patterned. The absence of the mandrel pattern may also create a mandrel line bridge issue. As the scale for patterning becomes smaller, the critical dimension of mandrel cuts and spacer thicknesses can easily vary at every structure being patterned on dies across the entire wafer. The variations in critical dimension for intrinsic cuts (holes) may pose further challenges in forming uniform patterning features.

In general, the subject disclosure describes a process for providing a semiconductor device that includes forming a pillar based mandrel cut as a non-mandrel feature before and after a mandrel-pull is performed. The process avoids the need to use a pinch-off of the spacer material between mandrels in the mandrel cut step conventionally performed. As a result, the mandrel and non-mandrel cuts can be self-aligned, which provides better consistency in the spacing between cuts and interconnects. In addition, defects such as nicks in the spacer material that occur during pinch-off are avoided. Spacer material nicks unintended bridging of adjacent structures.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the direction of the Figures being described. Since components of embodiments of the disclosure can be positioned in a number of different directions, the directional terminology is used for purposes of illustration and is in no way limiting. Thus, it will be understood that the spatially relative terminology is intended to encompass different directions of the device in use or operation in addition to the direction depicted in the figures. For example, if the device in the figures is turned over, elements described as "below" or "beneath" other elements or features would then be oriented "above" the other elements or features. Thus, for example, the term "below" can encompass both an orientation that is above, as well as, below. Similarly, an element described as "on top of" of another element may mean either that the element is positioned above and is not necessarily in direct contact with the underlying element. The device may be otherwise oriented (rotated 90 degrees or viewed or referenced at other directions) and the spatially relative descriptors used herein should be interpreted accordingly.

As used herein, the terms "lateral", "planar", and "horizontal" describe an orientation parallel to a first surface of a chip or substrate. In the disclosure herein, the "first surface" may be the top layer of a semiconductor device where individual circuit devices are patterned in the semiconductor material.

As used herein, the term "vertical" describes an orientation that is arranged perpendicular to the first surface of a chip, chip carrier, chip substrate, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together. The phrase "electrically connected" does not necessarily mean that the elements must be directly in physical contact together-intervening elements may be provided between the "connected" or "electrically connected" elements.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. Nor does describing an element as "first" or "second", etc. necessarily mean that there is an order or priority to any of the elements. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope. It should be appreciated that the figures and/or drawings accompanying this disclosure are exemplary, non-limiting, and not necessarily drawn to scale.

It is to be understood that other embodiments may be used, and structural or logical changes may be made without departing from the spirit and scope defined by the claims. The description of the embodiments is not limiting. In particular, elements of the embodiments described hereinafter may be combined with elements of different embodiments.

Definitions

Mandrel: A linear or ridge-like projection formed on a substrate. In the subject disclosure, a mandrel defines one of the lines on which an interconnect is formed in an underlying layer.

Interconnect: A structure that connects two or more circuit elements (such as transistors) together electrically.

Self-aligned: The patterning of a structure relative to alignment with another structure. Continuity line: A metal or other conductive trace or interconnect.

Discontinuity: A break or interruption in a continuity line.

Sacrificial: A structure formed as a placeholder feature that will be removed to define a new or different feature.

Substrate: Reference to a substrate may refer to material that provides a support structure to features in or on top of the substrate material. As used below, there may be more than one substrate present in an embodiment shown. Also, since embodiments below are generally shown in cross-section, it should be understood that a substrate for a layer with patterned features may not be visible in the view so as to highlight the features for the layer.

Example Methodology of Manufacture

In the following, a process describes a general method of forming a semiconductor device that uses a pillar-based mandrel cut as non-mandrel's before/after a mandrel-pull process. The fabrication of the devices described herein below can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, device 100 can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), backgrinding techniques, and/or another technique for fabricating an integrated circuit.

FIG. 1A is a cross-sectional schematic view of a semiconductor device 100 at an intermediate stage of fabrication. There is a substrate 105 and a stack of dielectric layers formed on top of the substrate 105, including a first insulating layer 115, a spacer layer 120, and a second insulating layer 125. In some embodiments, an interconnect layer 110 may be formed on the base semiconductor substrate 105 prior to formation of the first insulating layer 115. The interconnect layer 110 may be made from a silicon oxycarbonitride (SiCNO) film or other similar dielectric. At the intermediate stage of fabrication shown, the interconnect layer 110 does not yet include any interconnect structures. Interconnect structures such as continuity lines will be formed as a result of the subject process disclosed herein.

In one embodiment, the base semiconductor substrate 105 may be a bulk semiconductor substrate formed of, for example, silicon, or other types of semiconductor substrate materials that are commonly used in bulk semiconductor fabrication such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlIAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys. A dielectric layer 130 for formation of mandrel lines may be deposited on top of the second insulating layer 125.

Figures 2A, 2B:
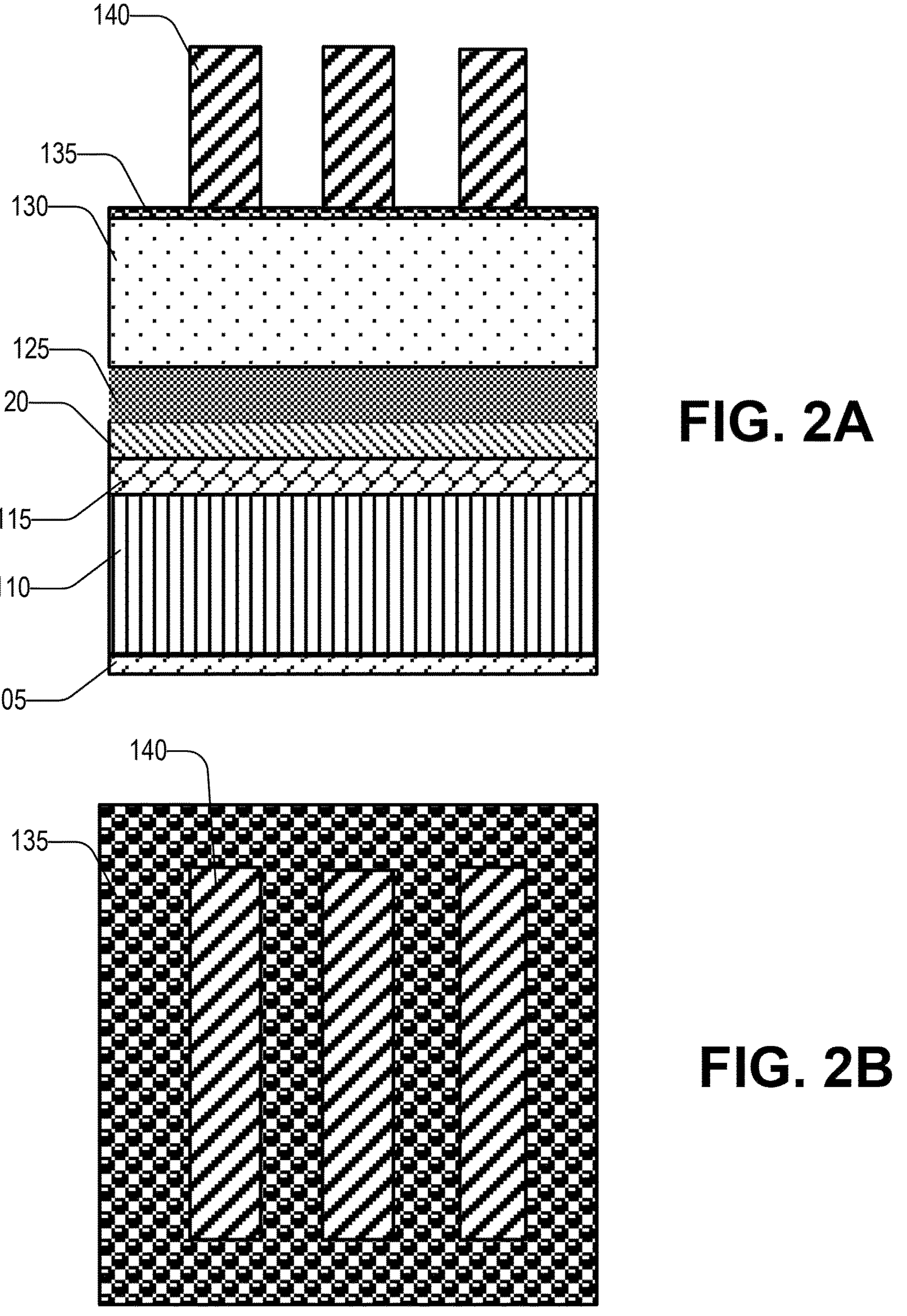
FIG. 2A is a cross-sectional schematic view of a mandrel formation lithography process, consistent with embodiments of the present disclosure.
FIG. 2B is a top view of the formation of FIG. 2A.
Figures 3A, 3B:
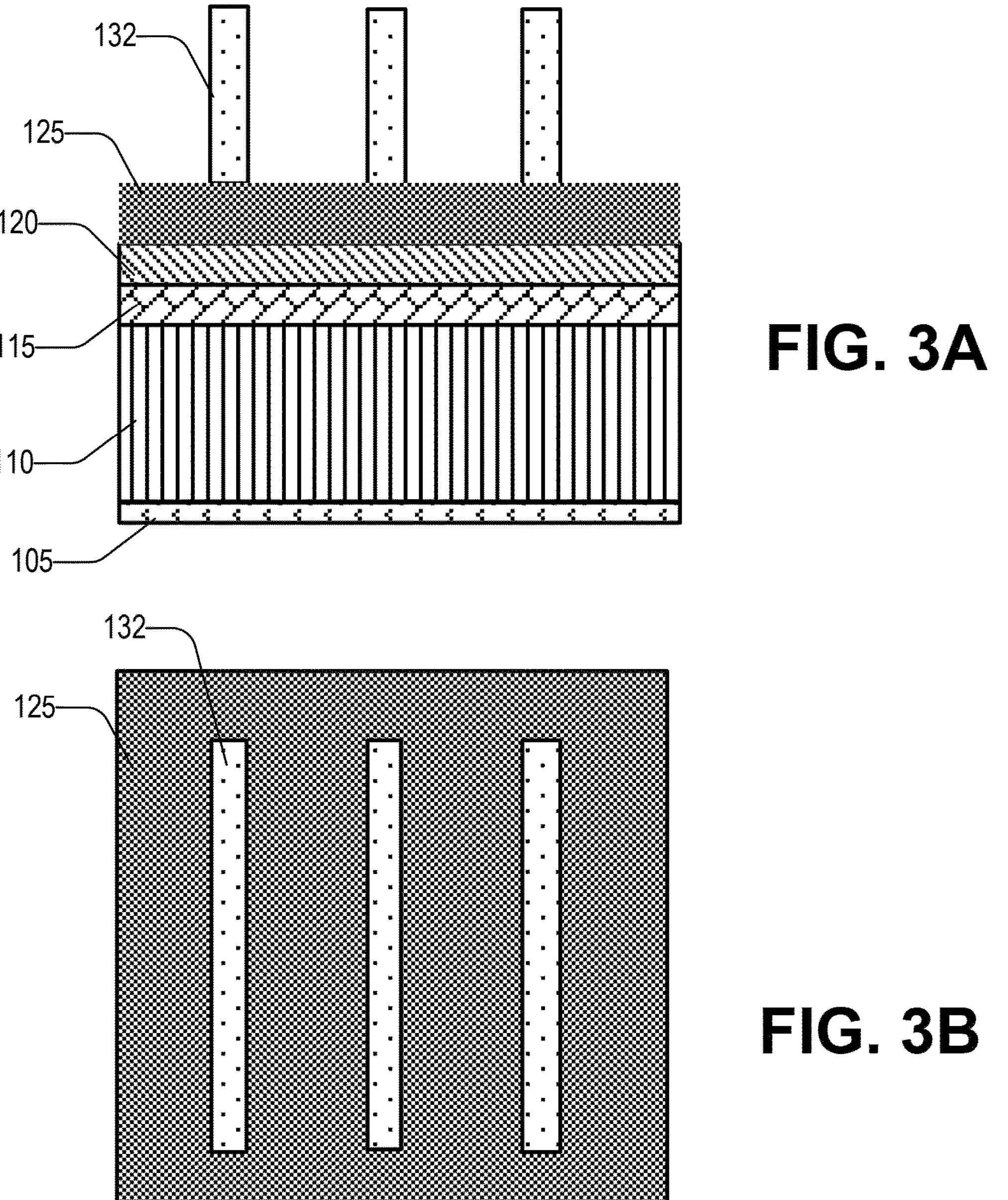
FIG. 3A is a cross-sectional schematic view of a mandrel etching process, consistent with embodiments of the present disclosure.
FIG. 3B is a top view of the formation of FIG. 3A.

FIGS. 2A and 2B show the formation of an etch mask to pattern the second insulating layer 125. An organic planarization layer (OPL) or an oxide diffusion layer (ODL) 135 may be deposited on top of the dielectric layer 130. Masking rows 140 may be formed on top of the layer 135. FIGS. 3A and 3B show the result of an etch process that removes the masking rows 140 and layer 135, and etches into the dielectric layer 130, leaving behind sacrificial mandrel features 132. The etching may stop at the second insulating layer 125.

Figures 4A, 4B:
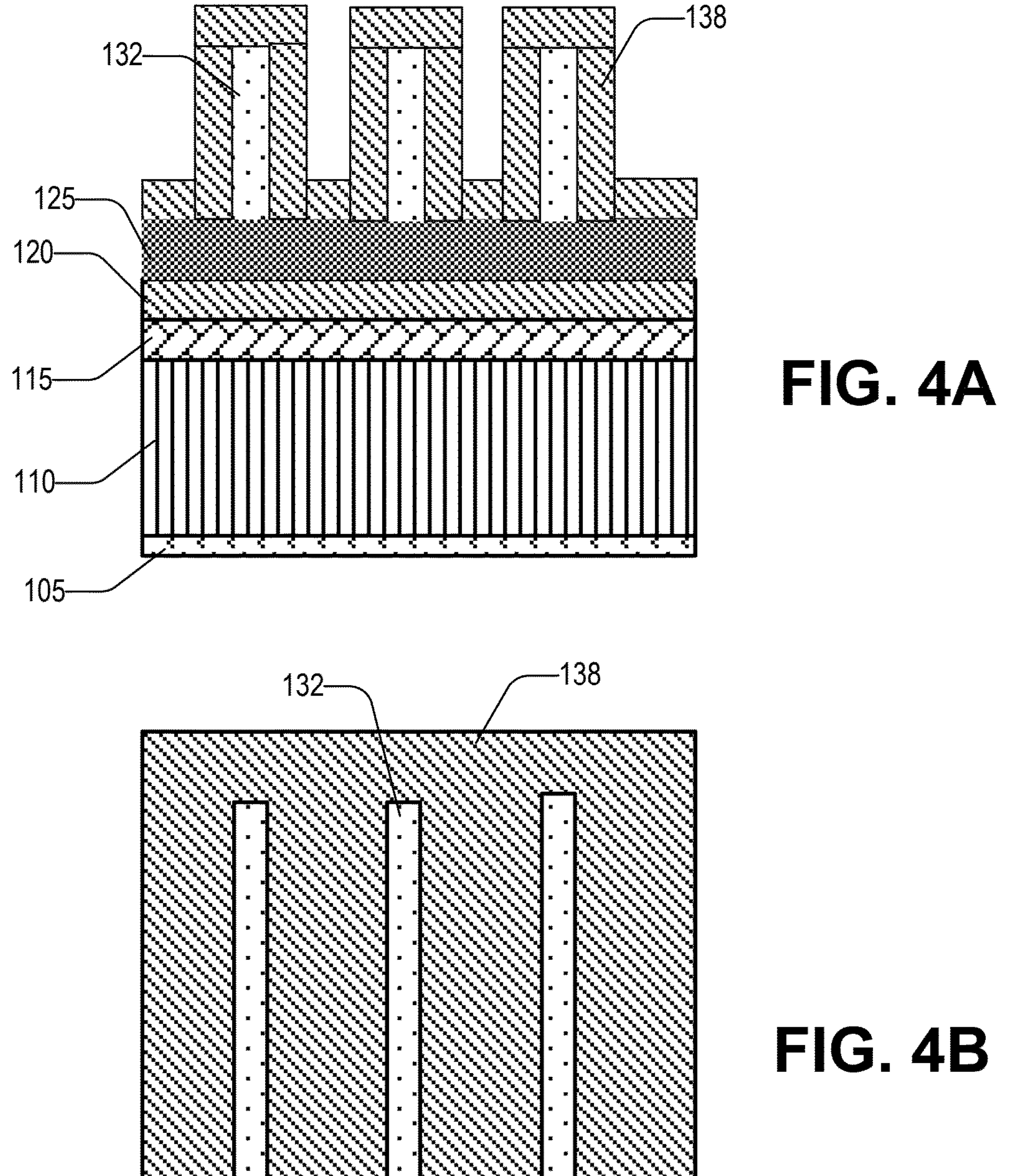
FIG. 4A is a cross-sectional schematic view of a spacer film deposition process, consistent with embodiments of the present disclosure.
FIG. 4B is a top view of the formation of FIG. 4A.
Figures 5A, 5B:
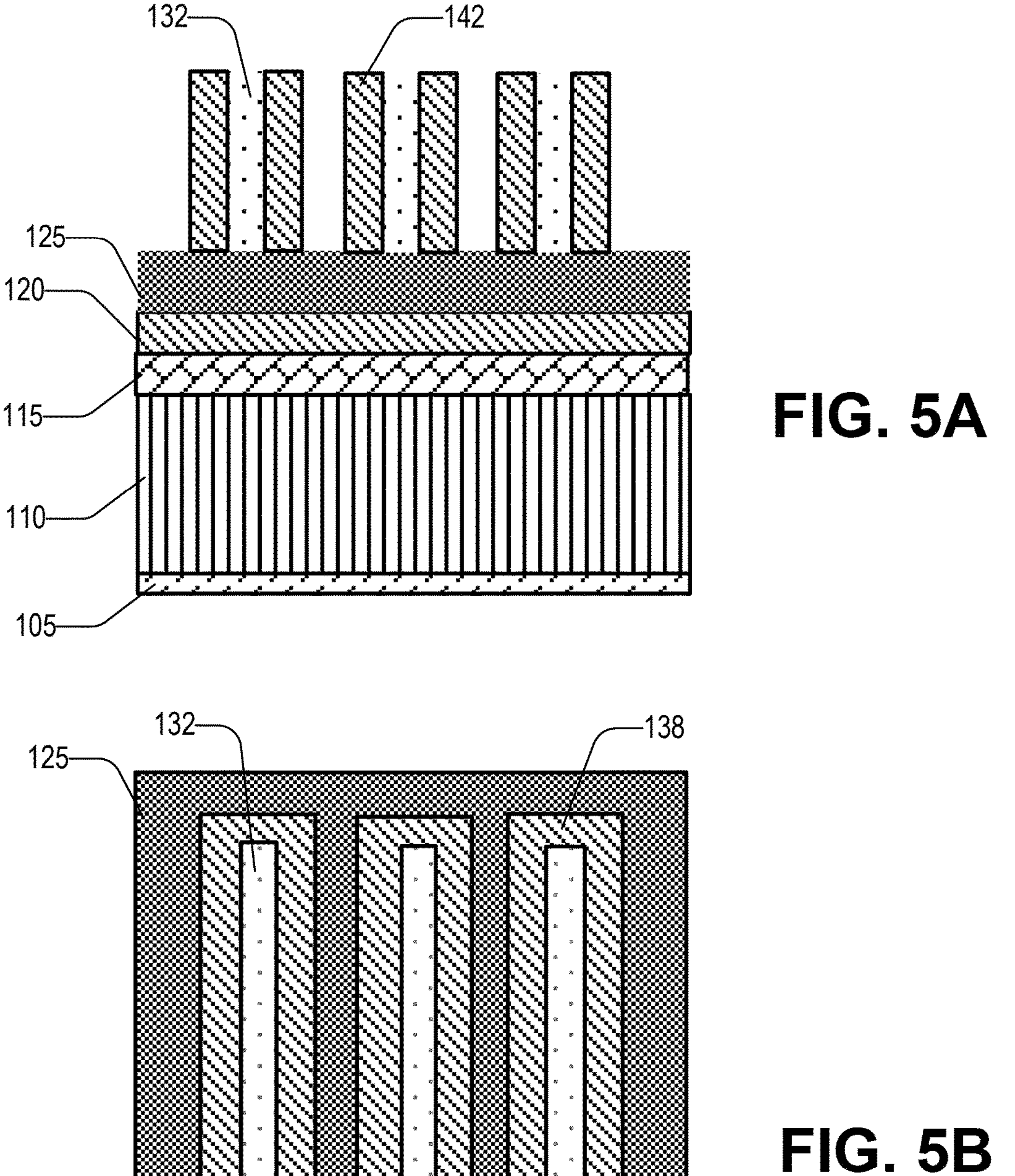
FIG. 5A is a cross-sectional schematic view of a spacer etch back process, consistent with embodiments of the present disclosure.
FIG. 5B is a top view of the formation of FIG. 5A.

FIGS. 4A and 4B show conformal deposition of a spacer material 138 surrounding the sacrificial mandrel features 132. The spacer material 138 may be the same material as the spacer layer 120, and thus, the same cross-hatching pattern is used for both films. FIGS. 5A and 5B show the result of etching back the spacer material 138 from the top edges of the sacrificial mandrel features 132 and from on top of the second insulating layer 125 and spaces between the sacrificial mandrel features 132. The resulting formation provides mandrel spacers 142 self-aligned to the sidewalls of each sacrificial mandrel feature 132. In some embodiments, a thickness of the mandrel spacers 142 on the sidewalls of the sacrificial mandrel features 132 is evenly formed. As may be appreciated, the thickness of the mandrel spacers 142 may be controlled, thus providing a uniform and consistent spacing between future formed mandrel and non-mandrel cut lines on the spacer layer 120.

Figures 6A, 6B:
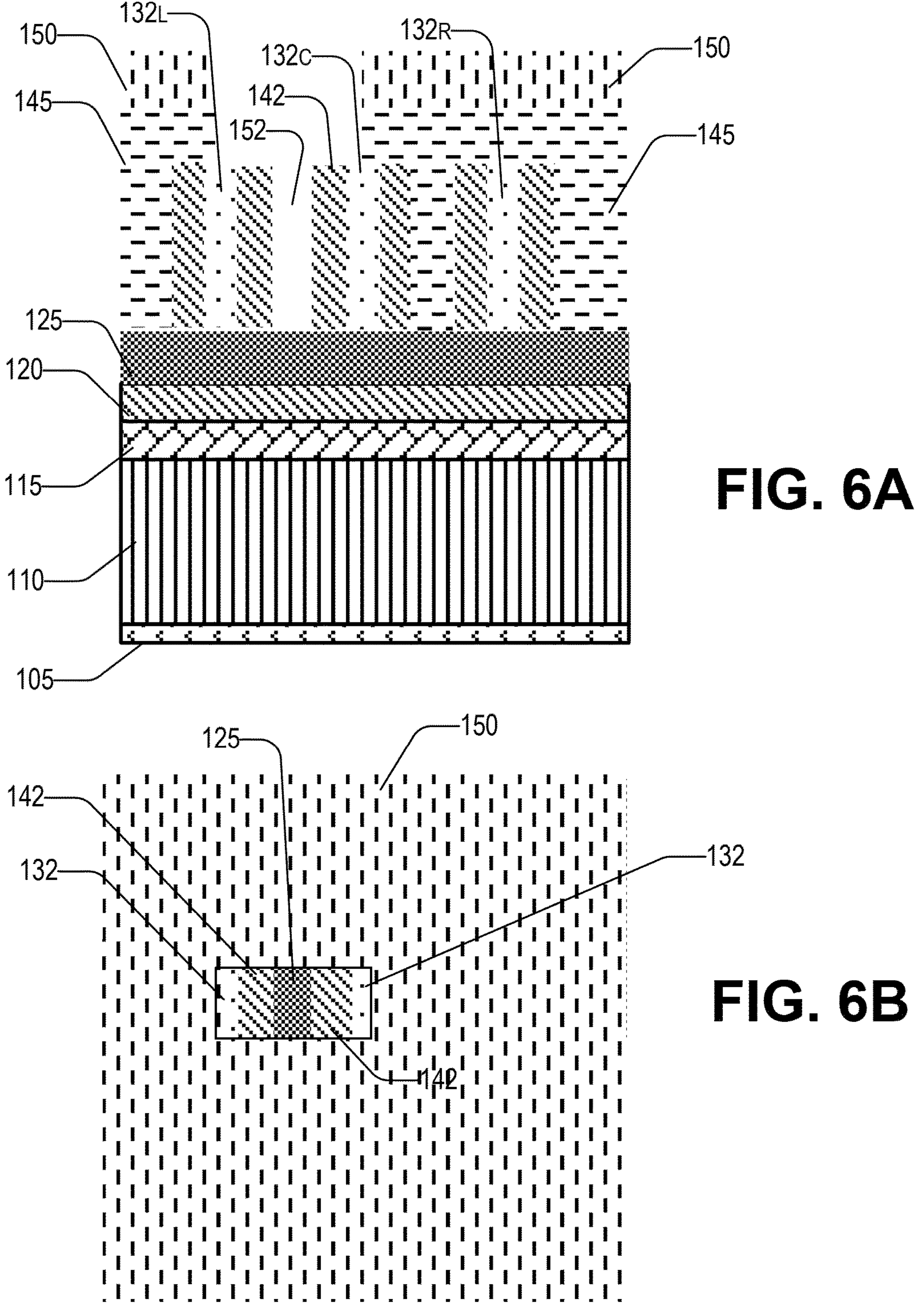
FIG. 6A is a cross-sectional schematic view of masking the formation in FIG. 5A for an NMN cut using a lithography etch back process, consistent with embodiments of the present disclosure.
FIG. 6B is a top view of the formation of FIG. 6A.

FIGS. 6A and 6B show a process of forming a non-mandrel cut line. A temporary insulating layer 145 and an etch mask 150 may encapsulate the top of the sacrificial mandrel features 132 (shown designated respectively by "L", "C", and "R" to represent the left, center, and right positioning of respective mandrel features), the spacer sidewalls 142, and on top of exposed sections of the second insulating layer 125. A trench 152 may be left open between the center sacrificial mandrel feature 132C and left side sacrificial mandrel feature 132L. The right-side sacrificial mandrel feature 132R may be completely encapsulated. The exposed trench 152 will be used to form a placeholder for a self-aligned non-mandrel cut line. As may be appreciated, the thickness of the non-mandrel cut line is controlled at this level of fabrication by defining the width of the trench 152 and the amount of etching performed previously on the spacer material 138 on the sides of the sacrificial mandrel features 132.

Figures 7A, 7B:
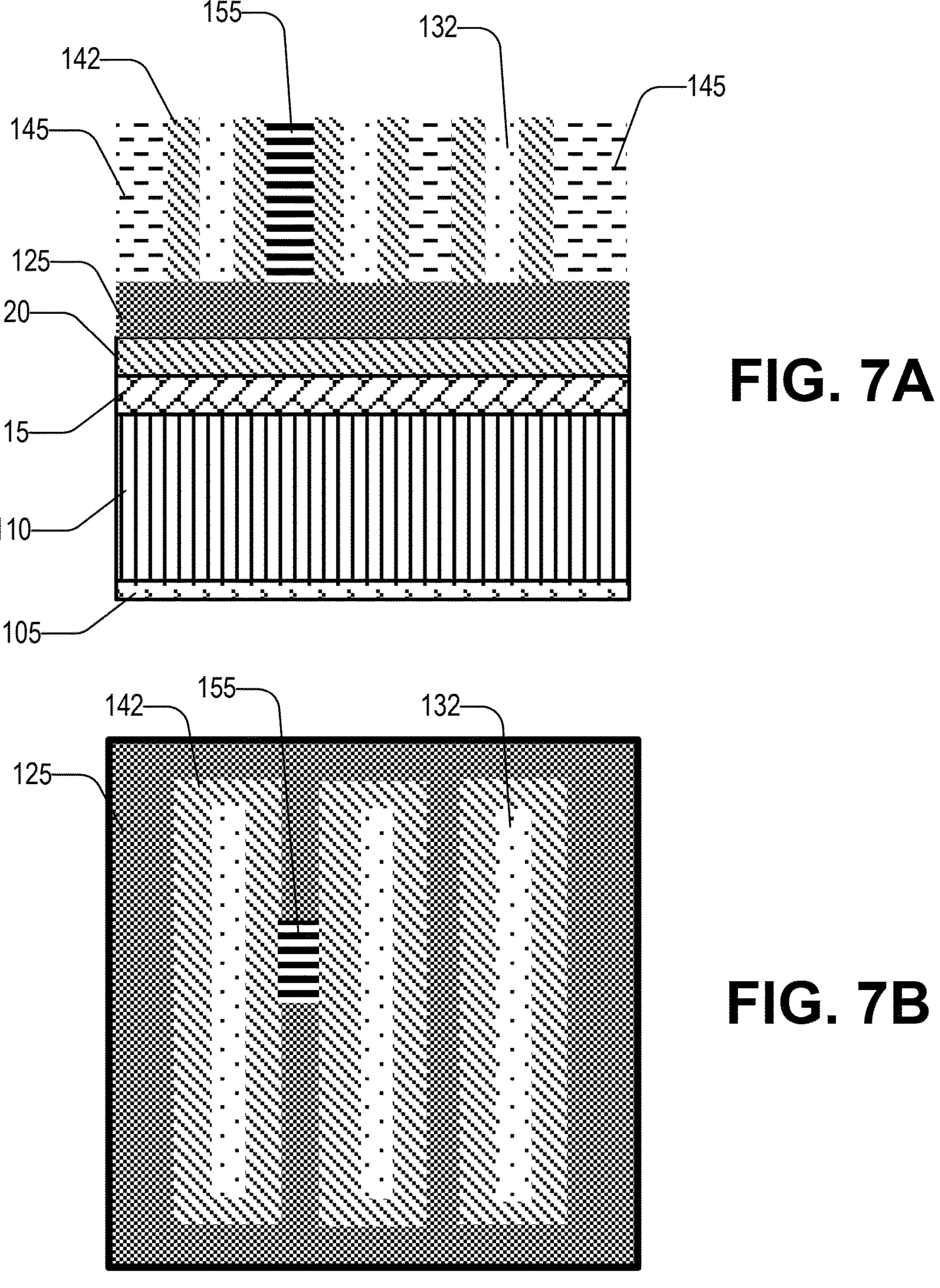
FIG. 7A is a cross-sectional schematic view of a fill process for the NMN cut, consistent with embodiments of the present disclosure.
FIG. 7B is a top view of the formation of FIG. 7A.
Figures 8A, 8B:
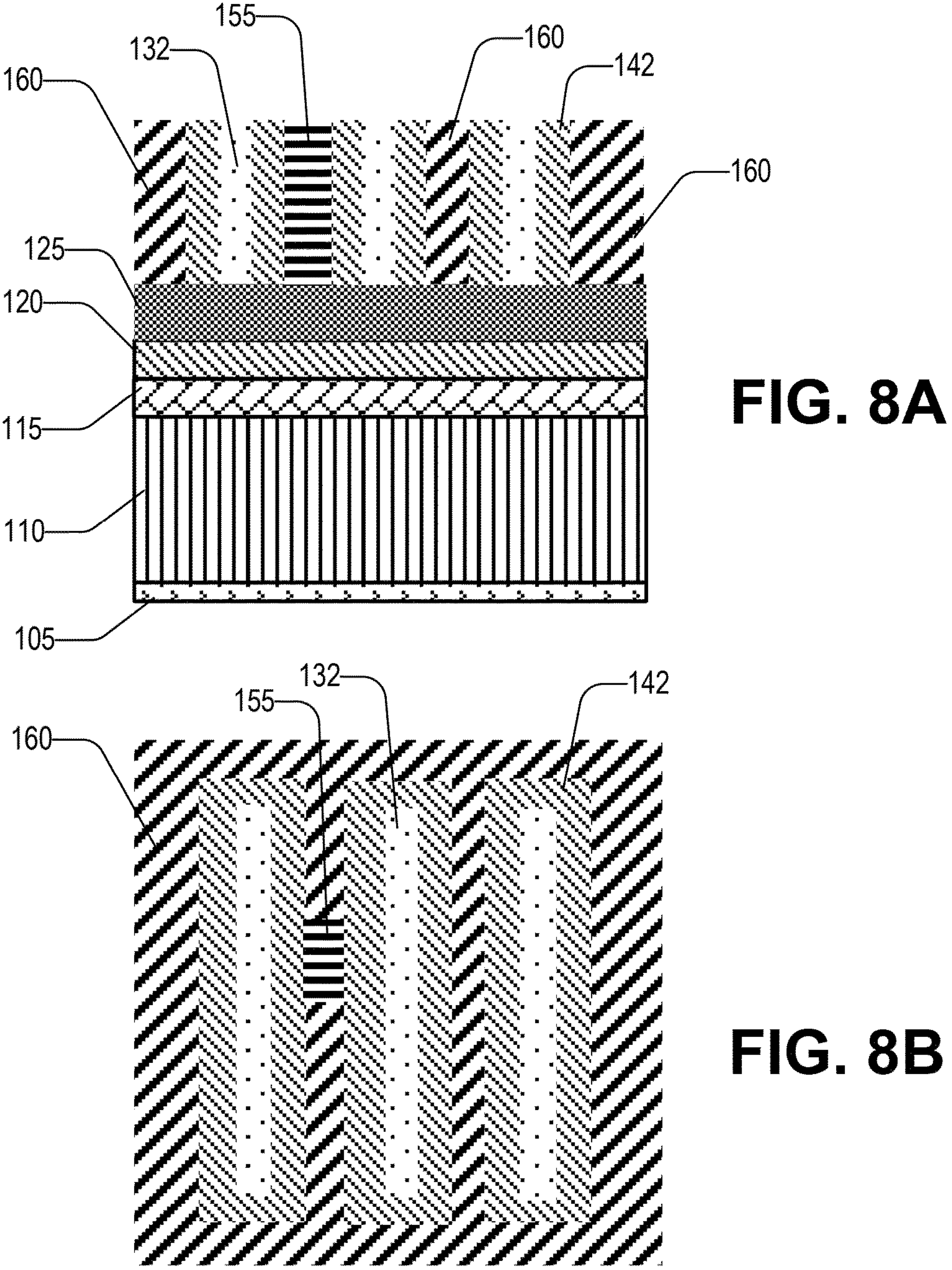
FIG. 8A is a cross-sectional schematic view of the formation in FIG. 7A after application of a chemical vapor deposition process, consistent with embodiments of the present disclosure.
FIG. 8B is a top view of the formation of FIG. 7A.

FIGS. 7A and 7B show removal of the temporary insulating layer 145 and etch mask 150 from the top of the sacrificial mandrel features 132 and mandrel spacers 142. The open trench 152 may be filled with a placeholder material 155 (for example, a gap-fill material such as SOG, SiOC, or ALD TiOX) using for example, electron beam deposition. FIGS. 8A and 8B show the result of removing temporary insulating layer 145 and depositing layer of flowable silicon dioxide 160 into the areas vacated by temporary insulating layer 145. A planarization process may be applied to all materials on top of second insulating layer 125.

Figures 9A, 9B:
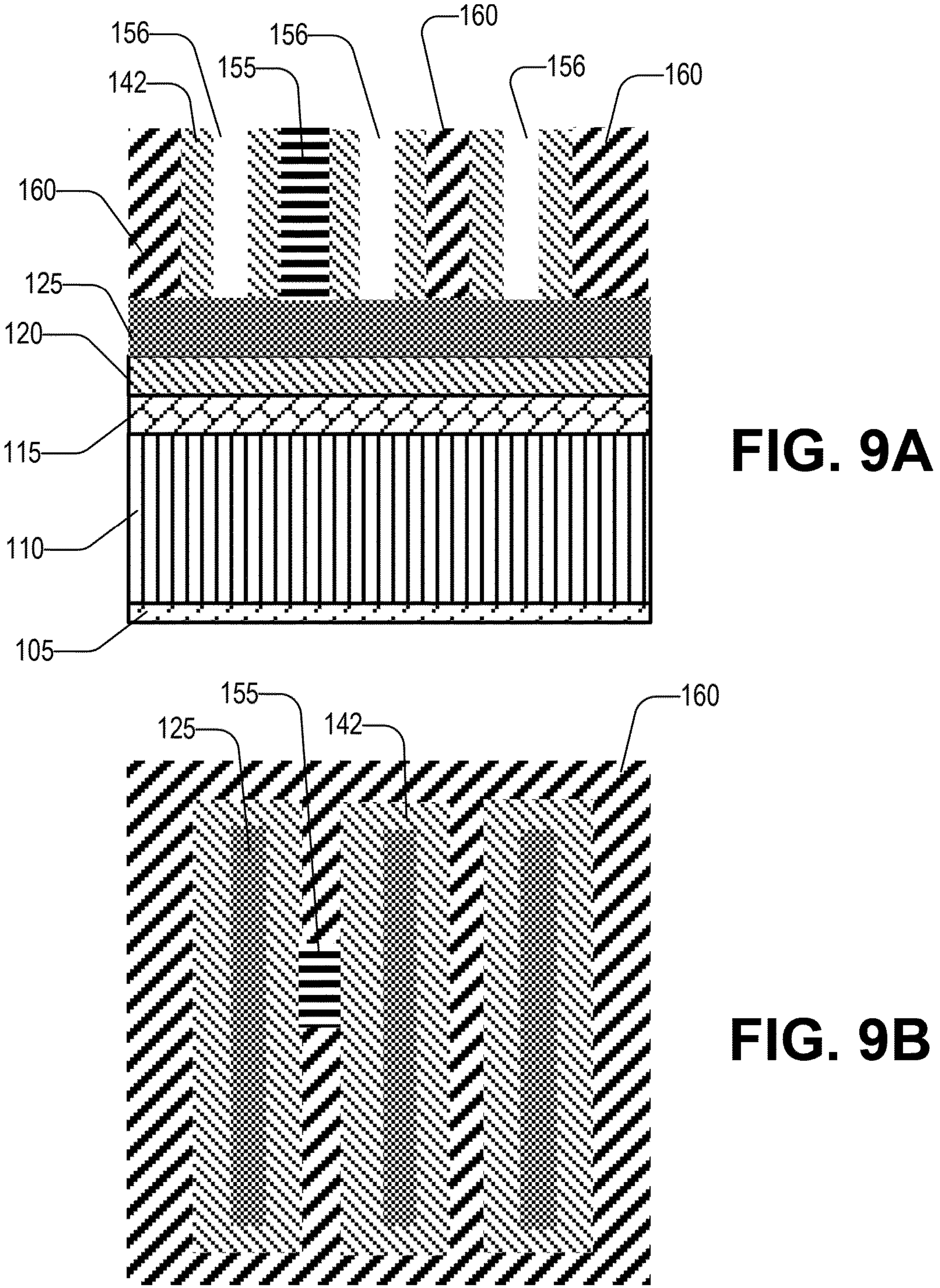
FIG. 9A is a cross-sectional schematic view of the formation in FIG. 8A after application of a mandrel pulling process, consistent with embodiments of the present disclosure.
FIG. 9B is a top view of the formation of FIG. 9A.
Figures 10A, 10B:
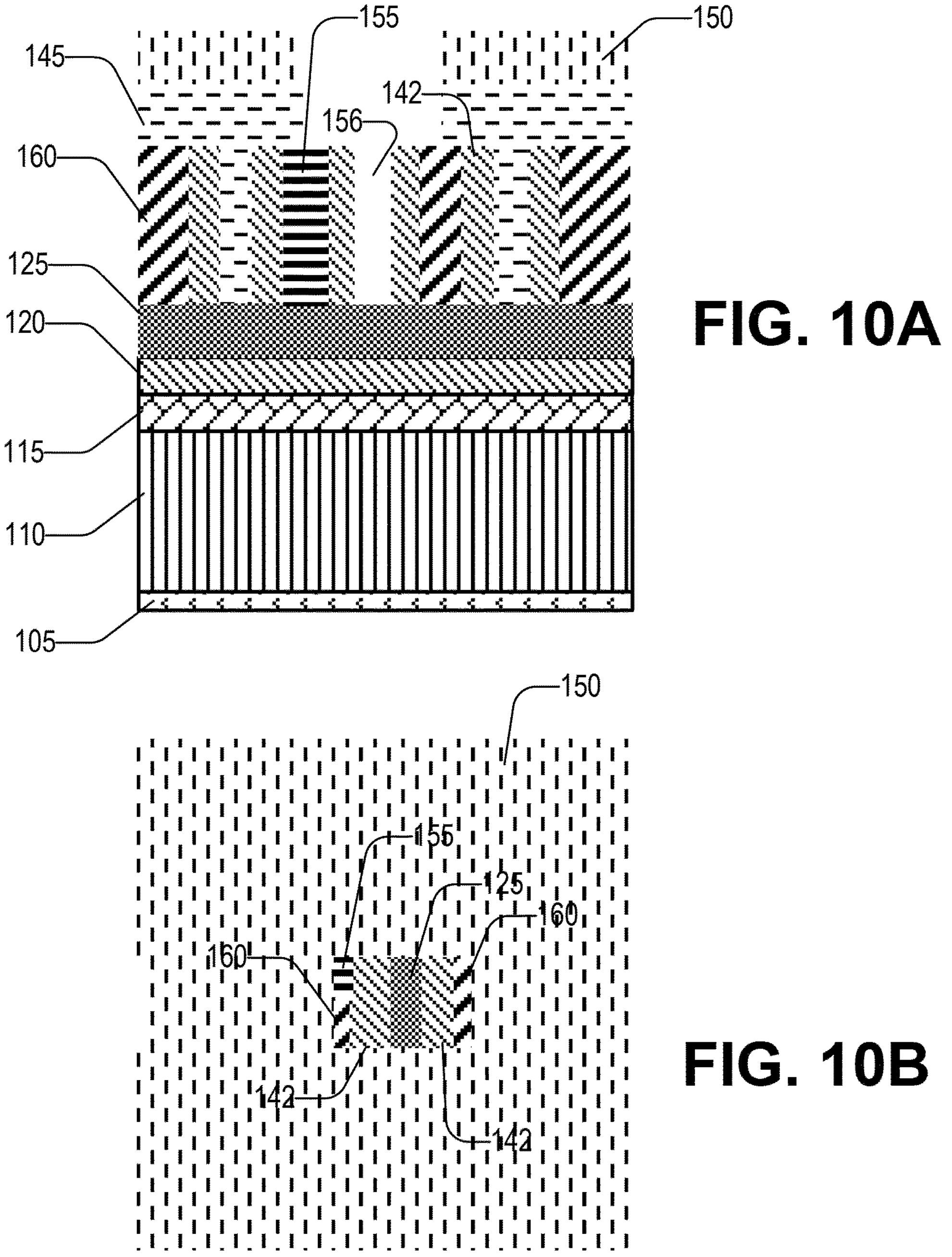
FIG. 10A is a cross-sectional schematic view masking the formation in FIG. 9A for a mandrel cut using a lithography etch back process, consistent with embodiments of the present disclosure.
FIG. 10B is a top view of the formation of FIG. 10A.
Figures 11A, 11B:
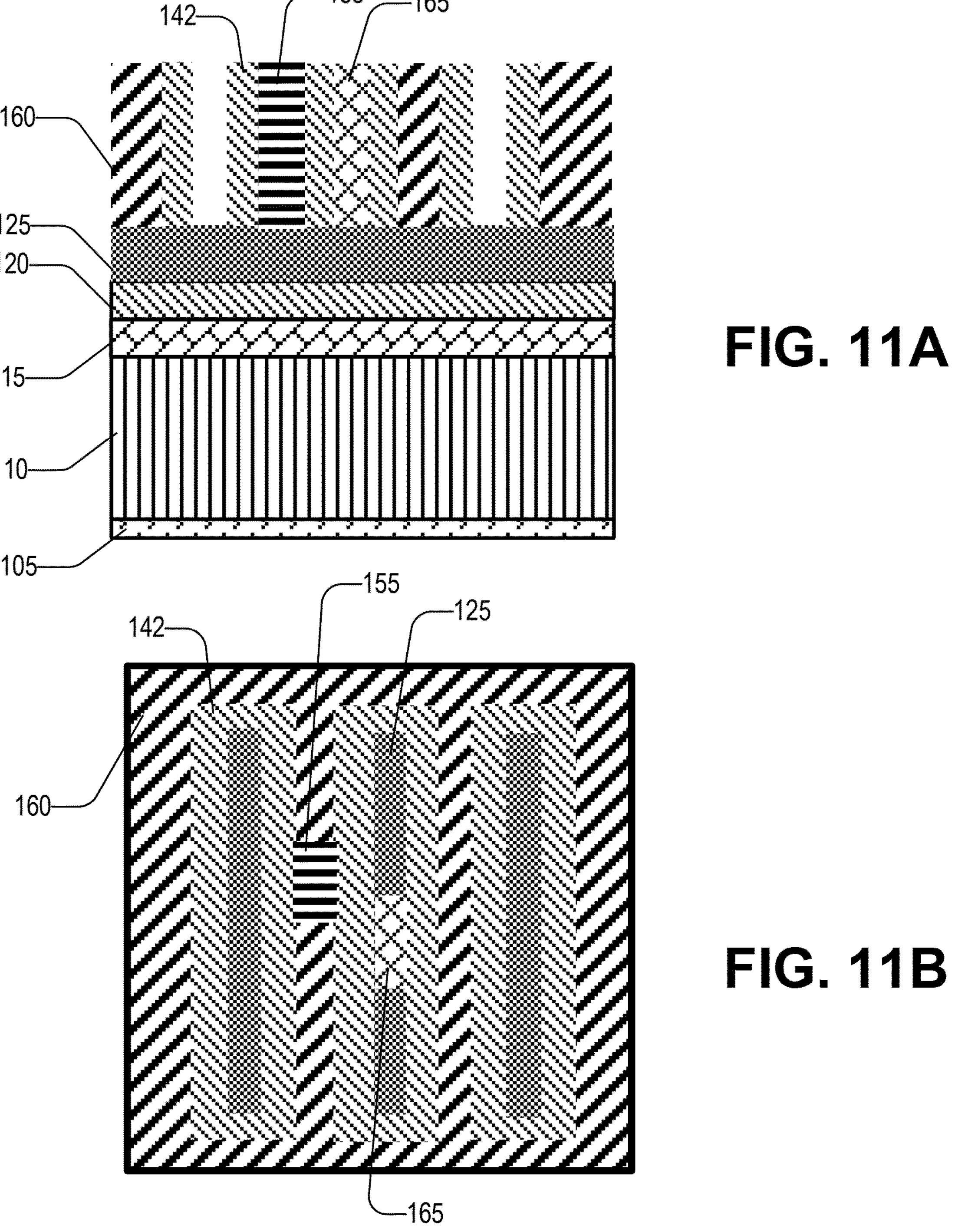
FIG. 11A is a cross-sectional schematic view of filling the mandrel cut in FIG. 10A, consistent with embodiments of the present disclosure.
FIG. 11B is a top view of the formation of FIG. 11A.

FIGS. 9A and 9B show the result of pulling the sacrificial mandrel features 132 leaving behind empty trenches 156. FIGS. 10A and 10B show a process of forming a mandrel cut line that is self-aligned to the adjacent mandrel spacers 142. The process includes masking off areas except for the center trench 156 left behind from the mandrel pulling. The masking may repeat using the insulating layer 145 and etch mask 150 (as were used previously as shown in FIGS. 6A and 6B). The exposed center trench 156 defines a mandrel cut line that is self-aligned relative to the adjacent sidewalls of mandrel spacers 142. In some embodiments, the mandrel cut line may be self-aligned to the sidewalls of the non-mandrel cut line. FIGS. 11A and 11B show filling of the center trench 156 for the mandrel cut line with a placeholder material 165. It may be appreciated that the critical dimension for the eventual mandrel line is consistently defined by the width of the trench and the controlled thickness of adjacent mandrel spacers 142. The temporary insulating layer 145 and etch mask 150 may be removed. As can be seen more clearly in FIG. 11B, the critical dimensions for the mandrel and non-mandrel cut lines are controlled relative to the surrounding mandrel spacers 142.

Figure 12A:
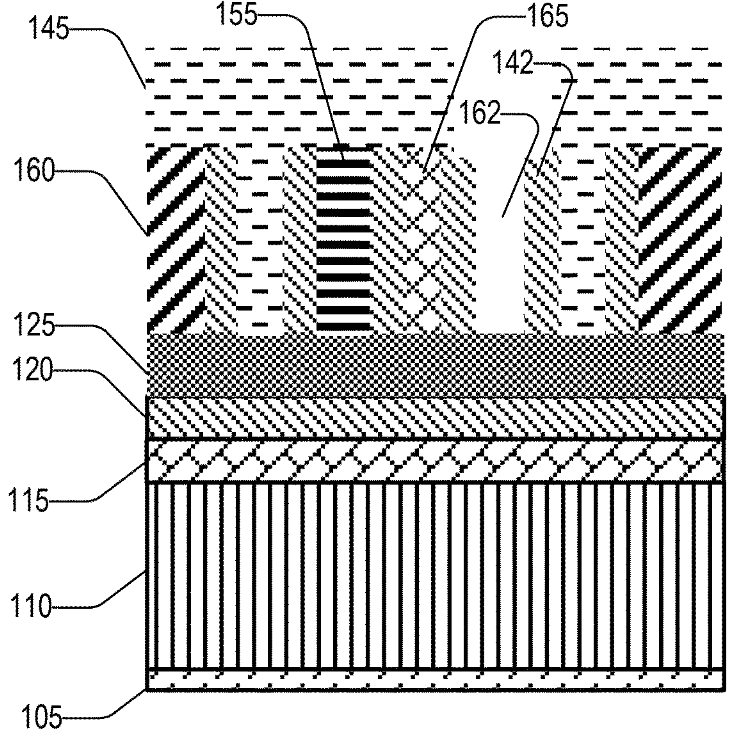
FIG. 12A is a cross-sectional schematic view of masking the formation in FIG. 11A, consistent with embodiments of the present disclosure.
Figure 12B:
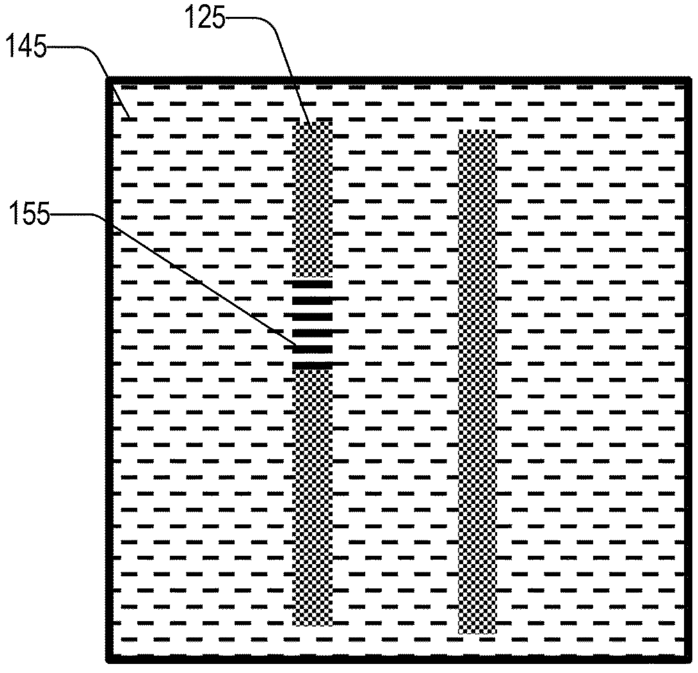
FIG. 12B is a top view of the formation of FIG. 12A.

FIGS. 12A and 12B show a process of forming a non-mandrel opening. The process includes masking off areas (using for example, temporary insulating layer 145) except for the trench 162 that is formed after a selective etching and removal of a line of flowable silicon dioxide 160. The placeholder material 155 for the non-mandrel cut may be resistant to the etching chemical used so it remains protected even if exposed as shown in FIG. 12B. The etching process forms the non-mandrel opening down to the second insulating layer 125.

Figure 13A:
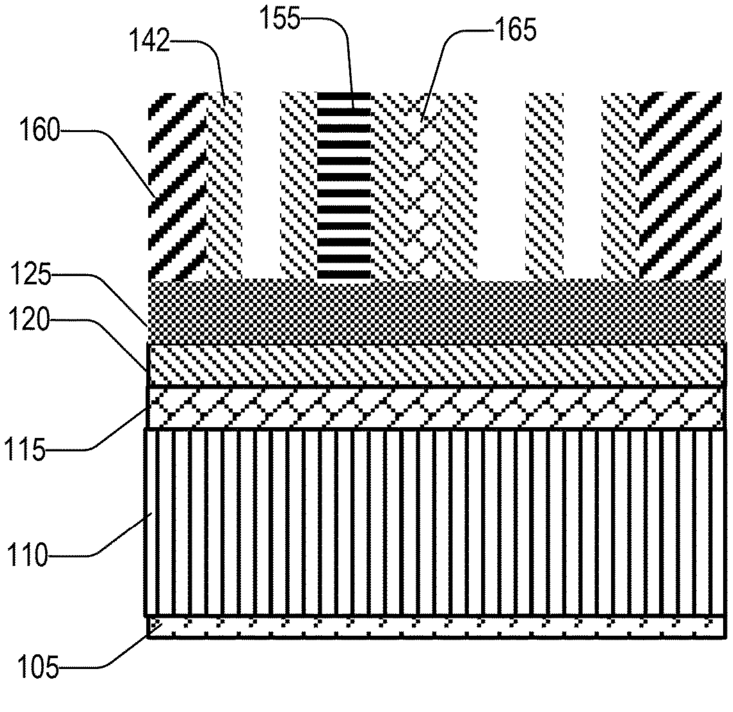
FIG. 13A is a cross-sectional schematic view showing removal of the mask on the formation in FIG. 12A, consistent with embodiments of the present disclosure.
Figure 13B:
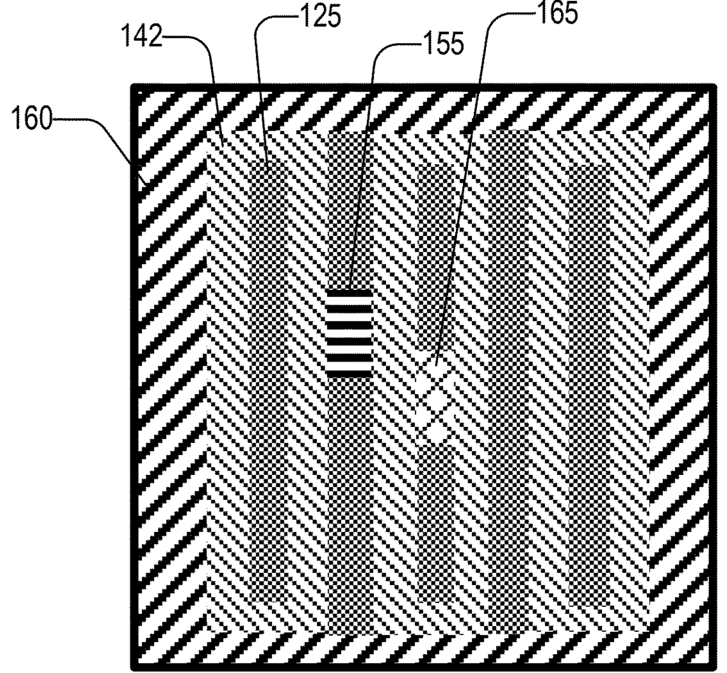
FIG. 13B is a top view of the formation of FIG. 13A.
Figure 14A:
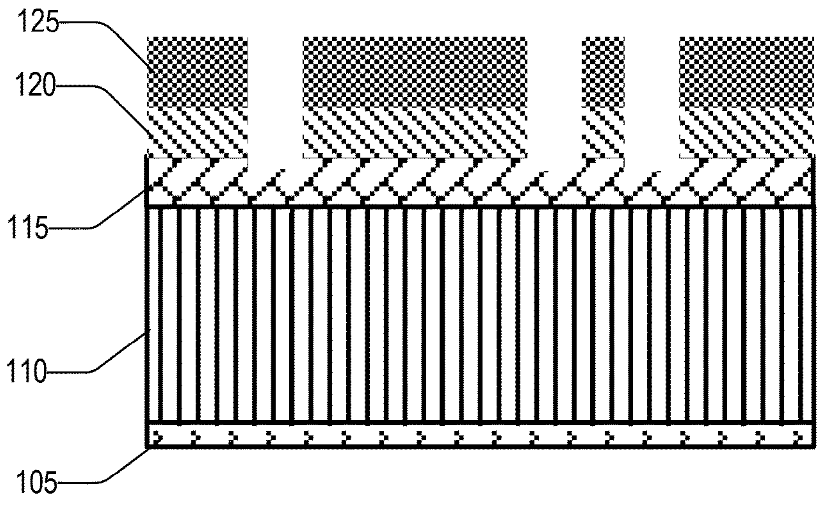
FIG. 14A is a cross-sectional schematic view showing the formation in FIG. 13A after a reactive ion etching process, consistent with embodiments of the present disclosure.
Figure 14B:
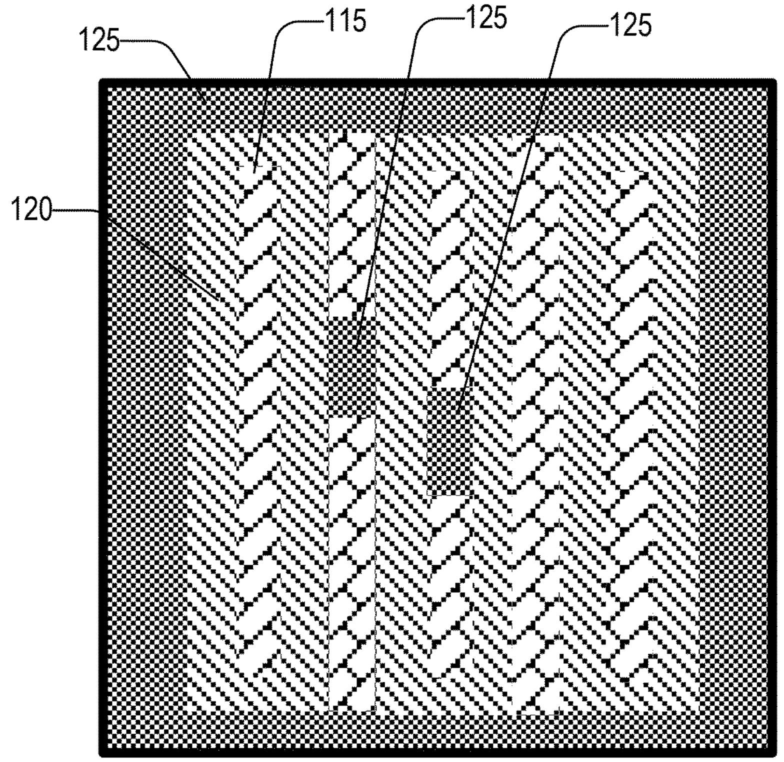
FIG. 14B is a top view of the formation of FIG. 14A.

FIGS. 13A and 13B show a process of forming additional non-mandrel opening lines down to the second insulating layer 125. FIGS. 14*a* and 14B show a process of etching down the placeholder material 155 for the non-mandrel cut line, the placeholder material 165 for the mandrel cut line, the mandrel spacers 142, and any remaining flowable silicon dioxide 160. Etching may be formed into and through both the second insulating layer 125 and the spacer later 120 exposing the first insulating layer 115 along the lines formed.

Figure 15A:
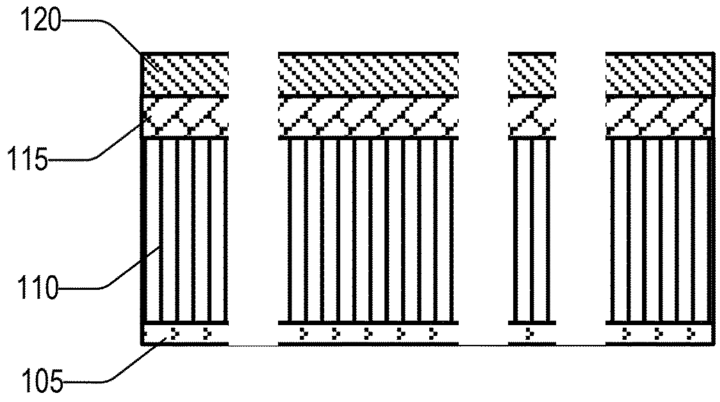
FIG. 15A is a cross-sectional schematic view showing the formation in FIG. 14A after an interlayer dielectric etching process, consistent with embodiments of the present disclosure.
Figure 15B:
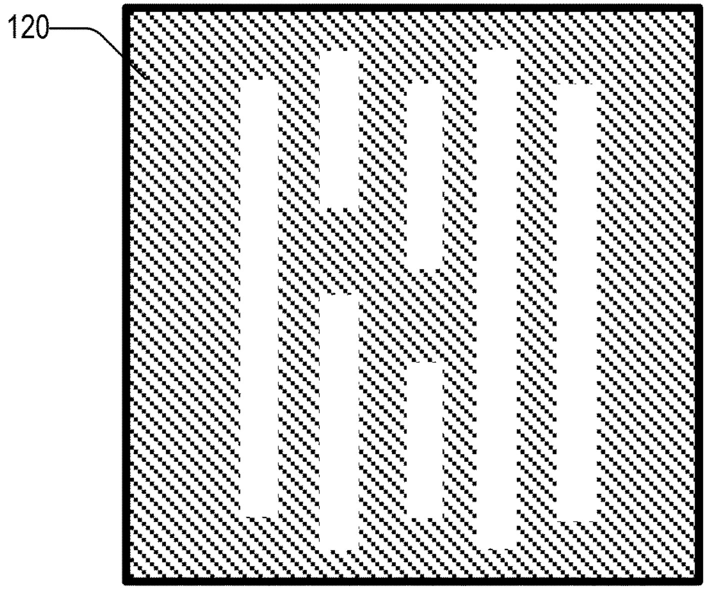
FIG. 15B is a top view of the formation of FIG. 15A.
Figure 16A:
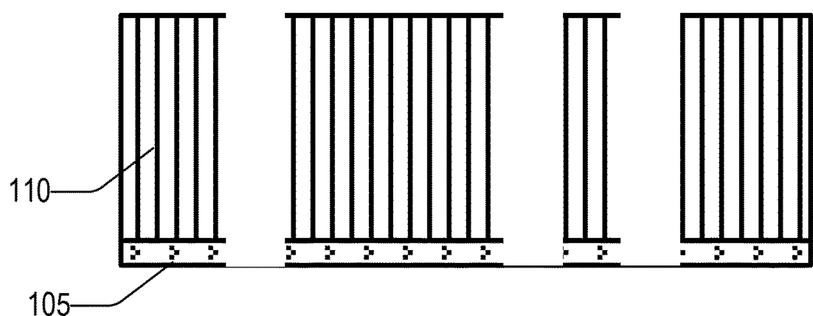
FIG. 16A is a cross-sectional schematic view showing the formation in FIG. 15A after a mask removal process, consistent with embodiments of the present disclosure.
Figure 16B:
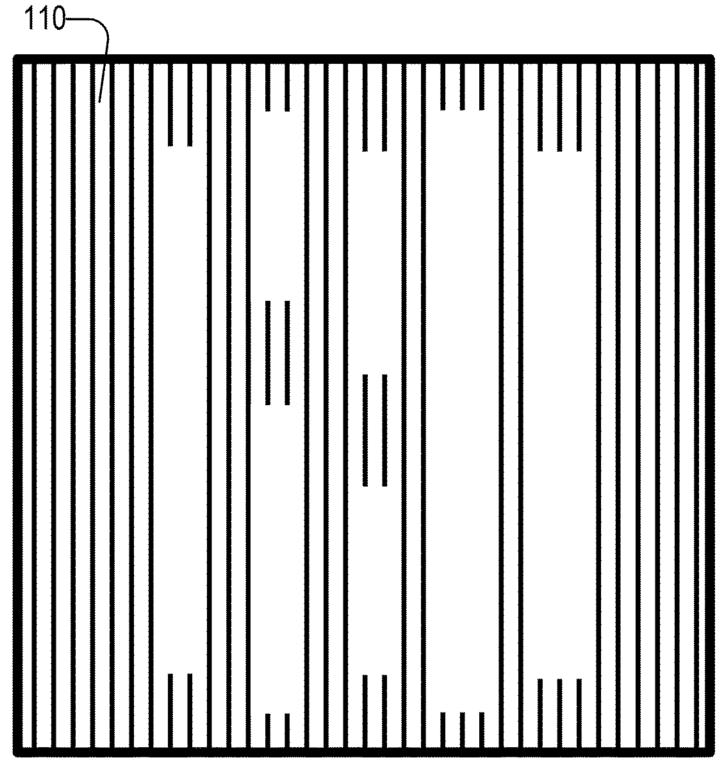
FIG. 16B is a top view of the formation of FIG. 16A.

FIGS. 15A and 15B show a process of dielectric etching that removes the second insulating layer 125 and forms openings down through both the first insulating layer 115 and the substrate 105. The openings will define the continuity lines in the interconnect layer 120. FIGS. 16A and 16B show further etching down that removes the first insulating layer 115.

Figure 17A:
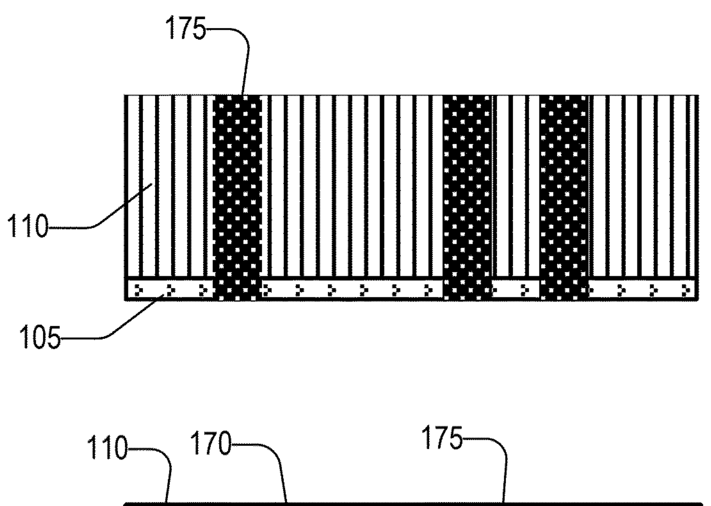
FIG. 17A is a cross-sectional schematic view showing the formation in FIG. 16A after a plating process, consistent with embodiments of the present disclosure.
Figure 17B:
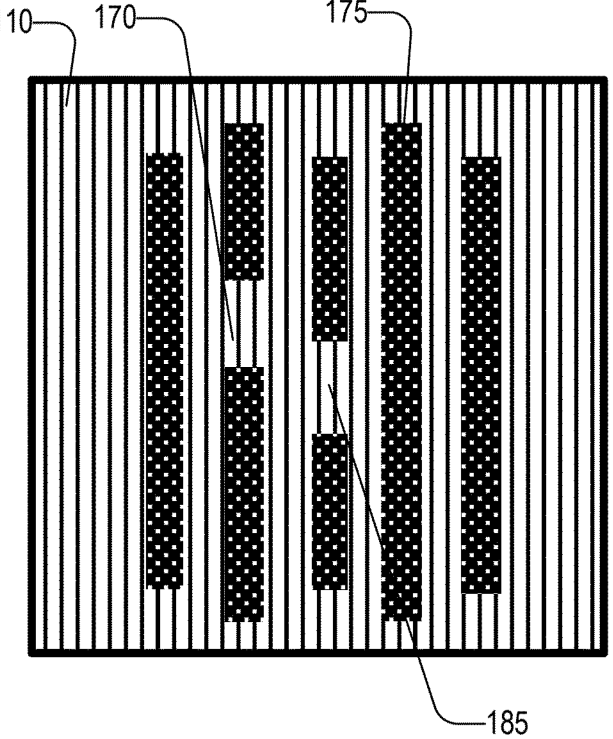
FIG. 17B is a top view of the formation of FIG. 17A.

FIGS. 17A and 17B show metallization applied to the openings to form metal lines 175. In the example illustrated, a first, a second, a third, a fourth, and a fifth metal line 175 are shown. Other embodiments may include more or less metal lines 175. The metal lines 175 represent for example, continuity lines in the interconnect layer 110 (or another layer) within the semiconductor device. The first, second, third, fourth, and fifth metal lines 175 may extend in the same direction. The first, second, third, fourth, and fifth metal lines 175 may be formed parallel to each other. The spacing between the metal lines 175 may be evenly distributed. A first of the metal lines 175 includes the mandrel cut 185. A second of the metal lines 175 includes the non-mandrel cut 170. The third, fourth, and fifth metal lines 175 may be a result of non-mandrel openings formed earlier and do not include a cut. It will be understood that other embodiments may include a cut on any of the metal lines 175. In some embodiments, the metal lines 175 that are illustrated with cuts 170 and 180 may not necessarily have a cut. In yet other embodiments, a metal line 175 may include more than one cut. The resulting non-mandrel cut 170 may be positioned in self-alignment relative to adjacent sidewalls of the interconnect layer 110. The resulting mandrel cut 180 may be positioned in self-alignment relative to adjacent sidewalls of the interconnect layer 110.

The regions of dielectric material between adjacent metal lines 175 may be evenly distributed creating consistent spacing. This may be the result of patterning some of the non-mandrel lines so that the end result provides a first dielectric region and a second dielectric region self-aligned relative to a first metal line 175 and a second metal line 175. In some embodiments, a width of the first dielectric region is equal to a width of the second dielectric region. In some embodiments, the previously described etching processes may provide openings so that the metal lines 175 are arranged in a staggered array. For example, an end of a first metal line 175 may be staggered from an end of a second metal line 175. As can be seen, the non-mandrel cut 170 and mandrel cut 185 cut the metal lines 175 without clipping any neighboring lines or encroaching on the spacing between metal lines 175. As shown, some embodiments may position the mandrel cut 185 staggered from the non-mandrel cut 170.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits, and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A method of fabricating a semiconductor device, comprising:

providing a semiconductor structure having a dielectric stack and a mandrel layer positioned on the dielectric stack;

patterning an array of sacrificial mandrel features into the mandrel layer and on top of an insulating layer of the dielectric stack;

forming spacer elements located adjacent each of the sacrificial mandrel features;

forming a self-aligned non-mandrel cut adjacent to one of the spacer elements adjacent to one of the sacrificial mandrel features, filling the self-aligned non-mandrel cut with a first placeholder material, wherein a top surface of the first placeholder material is substantially uniform with a top surface of the adjacent spacer element;

removing the sacrificial mandrel features, wherein removal of the sacrificial mandrel features creates a plurality of trenches located between spacer elements;

forming one or more self-aligned mandrel cuts in one or more of the plurality of trenches after removal of the sacrificial mandrel features, filling the self-aligned mandrel with a second placeholder material, wherein the second placeholder material contacts adjacent spacer elements, wherein a top surface of the second placeholder material is substantially uniform with a top surface of the adjacent spacer elements;

forming non-mandrel openings on top of the insulating layer;

etching continuity line openings into the dielectric stack, wherein the self-aligned non-mandrel cut is disposed to interrupt a first of the continuity line openings and the one or more self-aligned mandrel cut cuts are disposed to interrupt a second of the continuity line openings; and forming metal lines in the continuity line openings, except where the self-aligned non-mandrel cut and the one or more self-aligned mandrel cuts are disposed.

2. The method of claim 1, further comprising removing the mandrel spacers prior to etching the continuity line openings.

3. The method of claim 1, wherein a thickness of the mandrel spacers on the sidewalls of the sacrificial mandrel features is evenly formed.

4. The method of claim 1, wherein the forming non-mandrel openings includes removing the first placeholder material and the second placeholder material.

5. The method of claim 1, further comprising forming a flowable silicon dioxide layer adjacent to the spacer elements and the self-aligned non-mandrel cut.

6. The method of claim 5, further comprising removing the flowable silicon dioxide layer, forming one or more of the continuity line openings.

7. A method of fabricating a semiconductor device, comprising:

providing a semiconductor structure having a dielectric stack, an interconnect layer in the dielectric stack, and a mandrel layer positioned on the dielectric stack;

patterning an array of mandrels into the mandrel layer and on top of an insulating layer of the dielectric stack;

forming spacer elements located adjacent each of the mandrels;

forming a self-aligned non-mandrel cut adjacent to one of the spacer elements adjacent to one of the mandrels, filling the self-aligned non-mandrel cut with a first placeholder material, wherein a top surface of the first placeholder material is substantially uniform with a top surface of the adjacent spacer element;

removing the mandrels, wherein removal of the mandrels creates a plurality of parallel trenches;

forming a self-aligned mandrel cut in one of the plurality of parallel trenches, filling the self-aligned mandrel cut with a second placeholder material, wherein the second placeholder material contacts adjacent spacer elements, wherein a top surface of the second placeholder material is substantially uniform with a top surface of the adjacent spacer elements;

forming non-mandrel openings on top of the insulating layer, wherein the non-mandrel openings are parallel to the plurality of parallel trenches;

forming continuity lines in the interconnect layer, wherein:

the continuity lines are formed in the plurality of parallel trenches and in the non-mandrel openings;

a first continuity line of the continuity lines includes the self-aligned non-mandrel cut; and a second continuity line of the continuity lines includes the self-aligned mandrel cut.

8. The method of claim 7, wherein an end of the first continuity line is staggered from an end of the second continuity line.

* * * * *